US007209241B2

(12) United States Patent
Emer et al.

(10) Patent No.: US 7,209,241 B2
(45) Date of Patent: Apr. 24, 2007

(54) METHOD FOR DETERMINING WAVEFRONT ABERRATIONS

(75) Inventors: Wolfgang Emer, Aalen (DE); Paul Graeupner, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/389,053

(22) Filed: Mar. 27, 2006

(65) Prior Publication Data

US 2006/0164655 A1    Jul. 27, 2006

Related U.S. Application Data

(63) Continuation of application No. 10/445,076, filed on May 27, 2003, now Pat. No. 7,019,846.

(30) Foreign Application Priority Data

May 24, 2002   (DE)   ............... 102 24 363

(51) Int. Cl.
*G01B 11/02* (2006.01)
*G01B 9/02* (2006.01)
(52) U.S. Cl. .................. 356/512; 356/515; 356/520
(58) Field of Classification Search .................. 356/72, 356/73, 489, 495, 511–515, 518, 520
See application file for complete search history.

(56) References Cited

U.S. PATENT DOCUMENTS

| 6,027,447 | A  | 2/2000  | Li              |
| 6,312,373 | B1 | 11/2001 | Ichihara        |
| 6,329,112 | B1 | 12/2001 | Fukuda et al.   |
| 6,637,884 | B2 | 10/2003 | Martino         |
| 6,639,651 | B2 | 10/2003 | Matsuyama       |
| 6,646,729 | B2 | 11/2003 | van der Laan et al. |
| 6,721,940 | B2 | 4/2004  | Miwa et al.     |
| 6,736,509 | B2 | 5/2004  | Martino et al.  |

(Continued)

FOREIGN PATENT DOCUMENTS

DE    198 20 785 A1    10/1999

(Continued)

OTHER PUBLICATIONS

Moers et al, "Application of the Aberration Ring Test (ARTEMIS™) To Determine Lens Quality and Predict its Lithographic Performance", SPIE, The 26th Annual International Symposium on Microlithography, Feb. 25-Mar. 2, 2001, Santa Clara, CA.

(Continued)

*Primary Examiner*—Gregory J. Toatley, Jr.
*Assistant Examiner*—Patrick Connolly
(74) *Attorney, Agent, or Firm*—Sughrue Mion, PLLC

(57) ABSTRACT

In a method for manufacturing an optical imaging system, wavefront aberrations caused by an optical imaging system are determined before and after transporting the optical imaging system. At least some of the aberration parameters which are determined in the preceding determination are used as a given precondition for determining aberration parameters in the subsequent determination. This results in a hybrid method, in which the strength of at least two measurement methods are used in a combined form, and specific weaknesses of any one method are avoided.

25 Claims, 1 Drawing Sheet

U.S. PATENT DOCUMENTS

| | | | |
|---|---|---|---|
| 6,739,721 | B2 | 5/2004 | Altmann |
| 6,753,954 | B2 | 6/2004 | Chen |
| 6,787,789 | B2 | 9/2004 | Van Der Laan |
| 6,788,400 | B2 | 9/2004 | Chen |
| 6,809,797 | B2 | 10/2004 | Baselmans et al. |
| 6,880,135 | B2 | 4/2005 | Chang et al. |
| 6,897,947 | B1 | 5/2005 | van der Laan et al. |
| 7,019,846 | B2 * | 3/2006 | Emer et al. .................. 356/512 |
| 7,075,651 | B2 * | 7/2006 | Tsukakoshi ................. 356/399 |
| 7,088,426 | B2 * | 8/2006 | Hirukawa et al. ............ 355/55 |
| 7,102,731 | B2 * | 9/2006 | Hirukawa et al. ............ 355/55 |
| 2002/0171815 | A1 | 11/2002 | Matsuyama et al. |
| 2003/0206289 | A1 | 11/2003 | Matsuyama |
| 2004/0027566 | A1 | 2/2004 | Suzuki et al. |
| 2004/0032579 | A1 * | 2/2004 | Emer et al. ................... 356/72 |
| 2004/0042094 | A1 * | 3/2004 | Matsuyama ................. 359/822 |
| 2004/0059444 | A1 * | 3/2004 | Tsukakoshi .................. 700/59 |
| 2005/0024612 | A1 * | 2/2005 | Hirukawa et al. ............ 355/55 |
| 2005/0122473 | A1 * | 6/2005 | Curatu ....................... 351/200 |
| 2005/0200809 | A1 * | 9/2005 | Dreher et al. ............. 351/246 |
| 2005/0202328 | A1 * | 9/2005 | Smith et al. ................... 430/30 |
| 2005/0206850 | A1 * | 9/2005 | Shimizu et al. .............. 353/55 |
| 2005/0213097 | A1 * | 9/2005 | Baselmans et al. ......... 356/399 |
| 2005/0237506 | A1 * | 10/2005 | Reisinger et al. ............. 355/55 |
| 2006/0119823 | A1 * | 6/2006 | Hirukawa et al. ............ 355/55 |
| 2006/0126046 | A1 * | 6/2006 | Hansen ........................ 355/55 |
| 2006/0164655 | A1 * | 7/2006 | Emer et al. ................. 356/520 |
| 2006/0227306 | A1 * | 10/2006 | Hirukawa et al. ............ 355/52 |

FOREIGN PATENT DOCUMENTS

| | | |
|---|---|---|
| DE | 101 09 929 A1 | 11/2001 |
| JP | 113 04 653 A1 | 11/1999 |
| JP | 2000 266 640 A | 9/2000 |
| JP | 2000 294 488 A1 | 10/2000 |
| JP | 2002 258 131 A | 9/2002 |
| WO | WO 02 054 459 A1 | 7/2002 |

OTHER PUBLICATIONS van der Laan et al, "Aerial Image Measurement Methods for Fast Aberration Set-Up and Illumination Pupil Verification", *Proceedings of SPIE* 4346, pp. 394-407 (2001).

Dirksen et al, "Impact of High Order Aberrations on the Performance of the Aberration Monitor", *Proceedings of SPIE* 4000, pp. 9 et seq. (2000).

Bill Roberts et al., Pattern Placement Errors—Application of In-Situ Interferometer Determined Zernike Coefficients in Determining Printed Image Deviations, Challenges in Process Integration and Device Technology, Sep. 2000, pp. 25-32, vol. 4181, Santa Clara, CA, USA.

* cited by examiner

US 7,209,241 B2

METHOD FOR DETERMINING WAVEFRONT ABERRATIONS

This application is a continuation of U.S. application Ser. No. 10/445,076, filed May 27, 2003, now U.S. Pat. No. 7,019,846 which claims benefit of German Patent Application No. 10224363.8 filed on May 24, 2002, and which is incorporated into this application by reference.

BACKGROUND OF THE INVENTION

1. Field of the Invention

The invention relates to a method for determining wavefront aberrations for the characterization of imaging characteristics of an optical imaging system. The preferred field of application is the measurement of projection objectives for microlithography.

2. Description of the Related Art

Microlithographic projection exposure systems are used for producing semiconductor components and other finely structured components. In this case, a pattern of a mask or of a reticle is imaged with the aid of a projection objective on a substrate to which a light-sensitive layer has been applied. The finer the structures that are to be imaged, the greater the extent to which the quality of the projection that is produced is governed and limited by imaging errors in the optical imaging systems that are used. By way of example, these imaging errors influence the imaged line widths and the image position of the imaged structures.

The imaging characteristics are normally characterized on the basis of wavefront aberrations, in order to obtain a qualitative measure for the discrepancy between the actual image and the ideal image. Determining wavefront aberrations is a critical step in the production process of optical imaging systems, in order to make it possible to produce systems with minimal imaging errors, by means of appropriate adjustment. Since the imaging quality of optical high-performance systems is also critically dependent on environmental influences such as the temperature, pressure, mechanical loads and the like, monitoring of the imaging quality, possibly as well as aberration control by manipulations to the imaging system, are also essential at the location of use at the customer's premises. Reliable, sufficiently accurate measurement methods must be available for this purpose, to allow rapid measurement of the projection objectives in situ, that is to say in the installed space in a wafer stepper or wafer scanner.

The characterization of imaging errors by wavefront aberrations is based on the idea that, when an object in the form of a point is imaged by an ideal lens, the spherical wave which originates from the object continues on the image side of the lens as a spherical wave to the image, which is in the form of a point and which is located at the center of the spherical wave on the image side. In the case of an actual lens with aberrations, the shape of the wavefront on the image side is not a spherical shape, so that the image-side light beams are not combined in an image in the form of a point, but in a fuzzy image. In order to allow a quantitative description of the imaging errors that are produced, that wavefront which intersects the exit pupil of the imaging system on the optical axis is normally considered. The distance (in nanometres) between the actual wavefront and the ideal wavefront is referred to as the wavefront aberration. The wavefront aberration function in general has a complicated form. This function is normally described as the sum of standard functions $Z_i$. Various groups of functions of $Z_i$ can be used for the purpose of aberration characterization. The so-called "Zernike polynomials" are normally used in the field of microlithography. The Zernike polynomials or corresponding Zernike coefficients can be derived or extracted from different measurement methods.

Various methods are available for determining the wavefront aberration at the location of use, in which case a distinction can be drawn between direct and indirect methods for determining the current status of an objective.

In one known direct method, which is referred to in the following text as the LITEL method, local tilting of the wavefront is converted with the aid of a specially constructed reticle into distortion in the imaging plane. This is then measured using a standard box-in-box method, and the wavefront is reconstructed by calculation from this. The accuracy of the method is sufficient for most applications. However, the analysis time is in the range of several hours.

Measurements with different NA and exposure settings (multiple illumination settings, MIS) are carried out in each case for the available indirect methods. In this case, a distinction can be drawn between aerial imaging measurements and resist profile measurements. One resist-based measurement technique is the so-called aberration ring test (ART) (see, for example the article "Impact of high order aberrations on the performance of the aberration monitor" by P. Dirksen, C. Juffermans, A. Engelen, P. De Bisschop, H. Muellerke, Proc. SPIE 4000 (2000), pages 9 et seq. or "Application of the aberration ring test (ARTEMIS™) to determine lens quality and predict its lithographic performance", by M. Moers, H. van der Laan, M. Zellerrath, W. de Boeij, N. Beaudry, K. D. Cummings, A. van Zwolt, A. Becht and R. Willekers, lecture to the SPIE, the 26th Annual International Symposium on Microlithography, 25 Feb. to 2 Mar. 2001,Santa Clara, Calif.). In the aberration ring test, an annual object is imaged in the imaging plane. The ring diameter and ring shape deformations which can be measured on the imaged object for a focus series can be analyzed in the form of Fourier components, with each Fourier component corresponding to a specific class of aberrations (lumped aberrations), for example spherical, coma, astigmatism and trefoil distortion. It is assumed that there is an essentially linear relationship between the Fourier components which can be determined in this way and the wavefront aberrations which can be described by Zernike coefficients, so that individual Zernike coefficients can be extracted on the basis of a suitable model from lumped aberrations. This method has the disadvantage that the accuracy is dependent on the quality of the model which is used in the simulation. A comparison with aberration data which was obtained with the aid of high-precision direct interferometric measurements of wavefront aberrations (see DE 101 09 929) shows, however, that the present model is suitable only to a limited extent. Apart from this, the method becomes less stable the greater the number of orders of Zernike coefficients that are intended to be separated.

SUMMARY OF THE INVENTION

It is one object of the invention to provide a method for determining wavefront aberrations, which makes it possible to determine wavefront aberrations with high accuracy on the basis of measurements which can be carried out at the location of use with little time involved.

As a solution to this and other objects, this invention, according to one formulation, provides a method for determining wavefront aberrations for characterization of imaging characteristics of an optical imaging system comprising: determining wavefront aberrations which are caused by the imaging system, using a first measurement method; determining at least one first aberration parameter for the wavefront aberration on the basis of the first measurement method; determining wavefront aberrations which are caused by the imaging system, with the aid of a second measurement method, which is used at a different time than the first measurement method; and determining at least one second aberration parameter from the wavefront aberration on the basis of the second measurement method using at least one first aberration parameter which results from the first measurement method.

Preferred developments are specified in the dependent claims. The wording of all the claims is incorporated by reference into the description.

In the method according to the invention, the wavefront aberration caused by the imaging system is initially determined with the aid of a first measurement method. On the basis of the first measurement method, at least one first aberration parameter is determined from the wavefront aberrations thus determined. A set with a number of first aberration parameters is normally determined. Aberration parameters for the purposes of this application are suitable numerical or functional representations which allow or represent a quantification of the wavefront aberrations determined by the measurement method. A second measurement method is used at a different time than the first measurement method, and may be based on a different measurement principle to that of the first measurement method. Wavefront aberrations caused by the imaging system are likewise determined with the aid of this second measurement method. These wavefront aberrations are used as the basis for determining at least one second aberration parameter, which characterizes the wavefront aberration according to the second measurement method. Specific characteristics of such coefficients can also be used, for example the field dependency of Zernike coefficients. According to the invention, at least the one first aberration parameter is used for determining second aberration parameters. This means that the result of the first measurement method is included via this at least one first aberration parameter to be used in the evaluation of the second measurement method. This results in a hybrid method, in which the strengths of at least two measurement methods can be used combined, without the specific weaknesses of the methods needing to adversely affect the measurement.

In order that the results of the various measurement methods that are used can be compared with one another and can be calculated with respect to one another, a "common language" is advantageous at the level of the measurement results. It is advantageous for a first set of first Zernike coefficients to be determined using the first measurement method, which characterize the wavefront aberration as measured by the first measurement method and are used as first aberration parameters. The wavefront aberrations determined using the second measurement method can be represented with the aid of a second set of second Zernike coefficients. Suitable coefficients can be selected from the first Zernike coefficients, and can be taken into account when determining the second Zernike coefficients. A set with a number of such aberration parameters is preferably also determined in this case. Other aberration parameters which are suitable for describing wavefront aberrations can also be used, in particular those which can be converted to Zernike coefficients.

The inventors have found that, among the contributions to the overall wavefront aberration, there are certain types of aberration which react relatively insensitively to environmental influences such as temperature, pressure or mechanical influences. These are referred to in the following text as being stable, fluctuation-insensitive or not perceptible to fluctuations. In contrast, other Zernike coefficients are relatively susceptible to disturbances. These are referred to as unstable, susceptible to fluctuations or fluctuation-sensitive. If a power series approach is considered for imaging errors and their field profile for a rotationally symmetrical system, then it is possible to derive from symmetry superimpositions that the wave aberration function depends on the three variables $r^2$, $\phi^2$ and $r*\phi$, where r is the field radius, $\phi$ is the pupil radius and $r*\phi$ is the scalar product of the two. If the wave aberration function is developed into a power series of these three variables, this results in the terms shown in Table 1:

| Power in | | | |
|---|---|---|---|
| $r^2$ | $\phi^2$ | $r * \phi$ | Meaning |
| 0 | 0 | 0 | Phase offset, physically irrelevant |
| 1 | 0 | 0 | Phase offset, square in the field, physically irrelevant |
| 0 | 1 | 0 | Focus offset, constant in the field, can be compensated for by a wafer stage in lithography |
| 0 | 0 | 1 | Scale |
| 2 | 0 | 0 | Phase offset, high 4 in the field, physically irrelevant |
| 0 | 2 | 0 | Spherical aberration, constant in the field |
| 0 | 0 | 2 | Astigmatism, square in the field |
| 1 | 1 | 0 | Image shell, square in the field |
| 1 | 0 | 1 | Distortion, cubic in the field |
| 0 | 1 | 1 | Coma, linear in the field |
| | | | . . . Higher orders . . . |

The inventors have found that, irrespective of their type, disturbances to the system precipitate in the lower orders first of all. The scale and the focus offset react to the greatest extent, that is to say first-order terms, to disturbance influences. The Seidel aberrations follow in the next order. This knowledge gained by the inventors has been confirmed by sensitivity calculations on specific objective designs: the optical performance reacts in the sequence of the orders of the power series development not only for environmental influences, such as temperature and pressure, but also for mechanical fluctuations in the lens separations. It is possible to derive from this that aberration contributions of higher orders are more stable, that is to say they are relatively insensitive to transport-dependent changes, changes in the environmental conditions, etc., than aberration contributions of lower orders. A large number of experiments have shown that terms up to and including the Seidel aberrations, may be subjected to significant, that is to say measurable, fluctuations, while the fluctuations in the area of higher orders can generally be ignored and may be within the measurement accuracy of the methods used to determine them. As the measurement accuracy increases, and the accuracy requirements increase, the limit between fluctuation-sensitive terms (lower-order terms) and relatively fluctuation-insensitive terms (higher orders) may be shifted towards higher orders.

On the basis of these considerations, it has been found to be advantageous for at least one stable, that is to say fluctuation-insensitive, first aberration parameter to be determined using the first measurement method, for example at least one higher-order Zernike coefficient and/or its field dependency, and for this at least one stable aberration parameter to be taken into account when determining or calculating the second aberration parameter while carrying out the second measurement method, with its value or profile as determined using the first measurement method. It is thus not necessary to vary all the parameters which can be varied during the evaluation of the second measurement method for matching Zernike coefficients or equivalent parameters to a measurement result. In fact, some values which are known from the previous measurement method may be assumed as given so that only the other values need be determined from the current measurement. The second measurement method can therefore be evaluated in a considerably more stable and accurate manner.

In practice, the first measurement method is normally carried out at the location where the optical imaging system is manufactured, and the second measurement method is carried out at the location of use of the optical imaging system, for example at the semiconductor chip manufacturer's premises. Wavefront aberrations are normally determined with very high accuracy in any case at the manufacturer's premises for qualification of the manufactured product. These can be recorded by means of a first set of first Zernike coefficients, and/or their field dependency. Transport then takes place from the location of manufacture to the location of use. The second measurement method can then be carried out on site on the imaging system after installation ready for use, before the start of production or during production pauses. Since, on the basis of the knowledge of the inventors, only lower-order aberration terms can change significantly between delivery of an imaging objective from the manufacturer and the commissioning of a wafer scanner or wafer stepper at the customer's premises, there is no need to measure the higher orders once again at the customer's premises. It is sufficient to use a suitable method to determine only the aberration terms for the lower orders, which are susceptible to fluctuations. If the higher-order terms are assumed to be known, the corresponding evaluation methods become more stable and accurate. Furthermore, methods which can be carried out particularly quickly may be chosen for the measurement at the location of use, allowing the fluctuation-susceptible terms to be determined with sufficient accuracy.

All methods which ensure adequate measurement accuracy, in particular for higher-order aberrations, may be used to carry out the first measurement method. Direct methods of the type mentioned initially are particularly suitable. Interferometric methods are preferable, owing to the high measurement accuracies that can be achieved. One such method, using Shearing interferometry, is described in DE 101 09 929. The disclosure content relating to this in this patent application is included by reference in the content of this description.

The second measurement method, which should normally be carried out at the location of use of the imaging system, can be chosen with regard to the required measurement duration and the measurement accuracy for the fluctuation-susceptible aberration terms that need to be determined. For example, any indirect method of the type mentioned initially (aerial image measurements or resist profile measurements) for different NA/exposure settings may be used. One suitable method using aerial image measurement, in which an aerial image scans the best focus positions in the x, y and z directions for various field locations and for various exposure settings in the area of the imaging plane of the imaging system, is described in the article "Aerial image measurement method for fast aberration set-up and illumination pupil verification" by H. van der Laan, M. Dierichs, H. van Greevenbroek, E. McCoo, F. Stoffels, R. Pongers and R. Willekers, Proc. SPIE 4346 (2001), pages 394–407. The disclosure content of this article is included by reference in the content of this description.

The previous and other properties can be seen not only in the claims but also in the description and the drawings, wherein individual characteristics may be used either alone or in sub-combinations as an embodiment of the invention and in other areas and may individually represent advantageous and patentable embodiments.

DETAILED DESCRIPTION OF THE PREFERRED EMBODIMENTS

Figure 1:
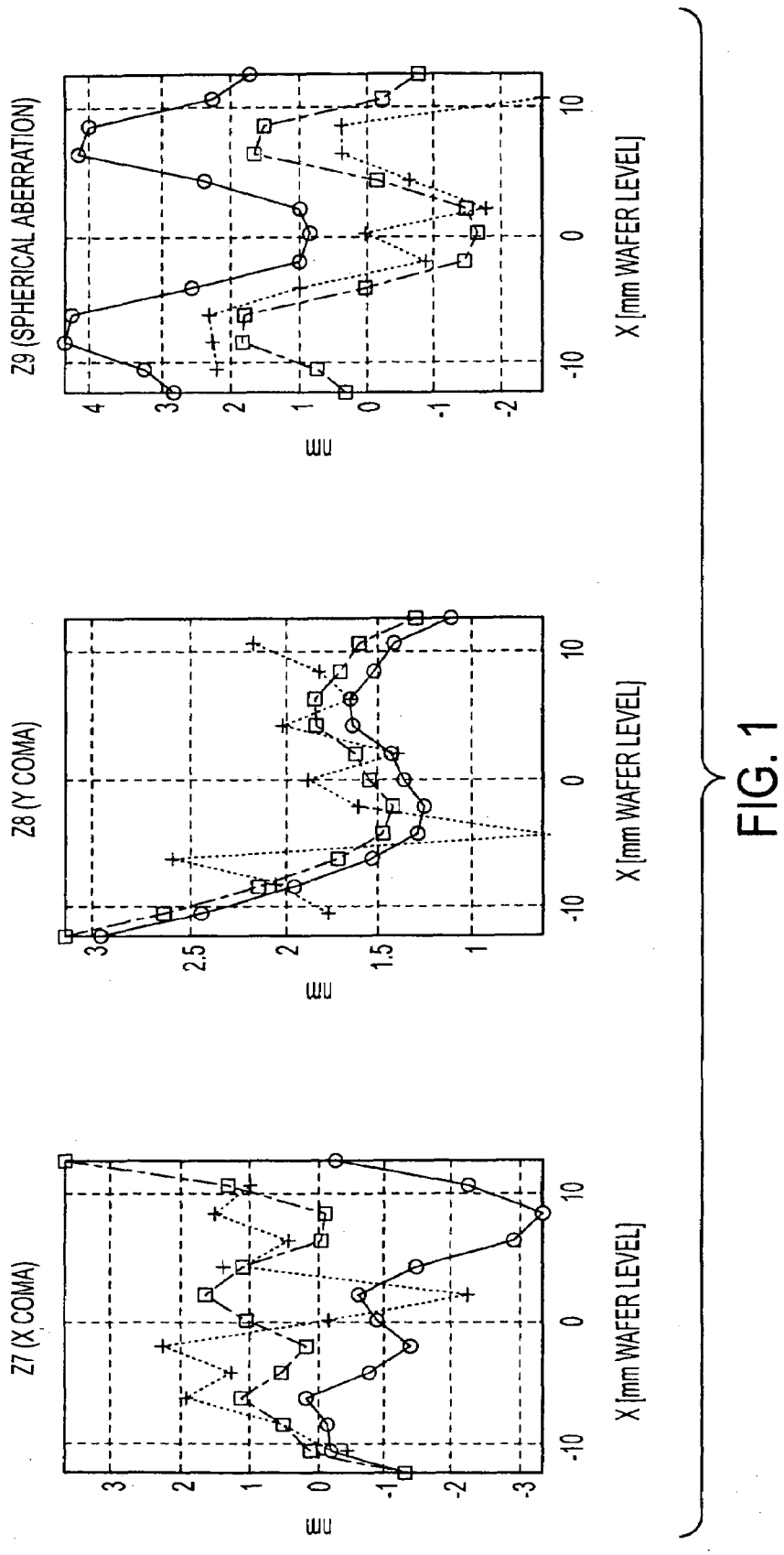
FIG. 1 shows an example of the correction of interferometry data using the measurement data of an in-situ aerial image measurement technique.

The invention will be explained with reference to an exemplary embodiment, in which an interferometric measurement of wave aberration is carried out at the premises of the manufacturer of a projection objective, using a Shearing interferometer according to German Patent Application DE 101 09 929.0. As noted above, the full disclosure of this application, including the description of the measurement device there, is included in the content of this description by reference. Any suitable method which is known to those skilled in the art may be used for determining aberration parameters which describe the measured wavefront aberrations. The described method allows direct measurement of wave aberrations in the pupil of the microlithographic projection objective with an accuracy which at the moment is not achieved by any other measurement means. After final acceptance of a manufactured projection objective, details are available about the wavefront aberrations produced by the objective, in the form of a set of interferometry data including, for example, the lower-order and higher-order Zernike coefficients (for example up to Z35) and the field profiles of these Zernike coefficients. This data forms the first aberration parameters.

After final acceptance, the projection objective is packaged to be protected against damage and is transported to a customer, which may be a long distance away, by suitable transportation means. At the customer's premises, the projection objective is installed in a wafer stepper which, in addition to the projection objective, also includes a suitable illumination device as well as manipulation devices for the reticle and wafer. The design of such microlithographic projection illumination systems is familiar to those skilled in the art. The wafer stepper may be delivered to an end customer, normally to a manufacturer for semiconductor chips or other finely structured components.

When the projection objective is installed, its imaging characteristics are determined using a suitable in-situ measurement technique, with test structures, in the case of this example, being imaged for different exposure and shutter settings. The results of these images can be characterized by various parameters, for example the best focus position of the imaged structure in the x, y and z directions, and/or the curvature and/or the asymmetry of an aerial image.

These parameters, which represent the results of the measurements, can be derived from the wave aberrations of the objective. In the example, the so-called linear model is used for this purpose, in which a parameter which corresponds to the exposure and shutter setting is represented as the sum of weighted Zernike coefficients in accordance with:

$$Parameter^s = \sum_n f_n^s \cdot Z_n \qquad (1)$$

where s is the corresponding exposure and shutter setting, $f_n^s$ is a weighting factor for the Zernike coefficient $Z_n$ for the exposure/shutter setting s, and $Z_n$ is the Zernike coefficient number n. It has been found that this model is applicable, with sufficient accuracy, for small aberrations, such as those which occur frequently in relatively modern projection objectives. The weighting factors are determined by theoretical simulations.

A combination of the imaging of test structures with different exposure/shutter settings with the linear model referred to makes it possible to deduce wavefront aberrations in the pupil by means of an inverse method applied to the measured lithographic parameters. However, only some of the lower-order Zernike coefficients can be determined in this way, and the accuracy is also limited (see the article by H. van der Laan et al. Proc. SPIE 4346 (2001), pages 394 to 407).

Detailed investigations and analyses by the inventors, for example based on correlation of aberration measurement data from the objective manufacturer, from the manufacturer of the wafer stepper and from the end customer, or based on the comparison of interferometry measurements in the case of objectives which have been returned to the manufacturer for repair purposes have shown that certain Zernike coefficients are relatively constant over time, that is to say they are essentially stable or not susceptible to fluctuations. On the other hand, groups of imaging errors can be defined which can vary over time, for example as a result of transport influences or other environmental influences. In the example, the following aberration parameters have been identified as being unstable or susceptible to fluctuations:

- very low order astigmatism which can be trimmed (square-law field profile),
- very low order astigmatism which can be centred (linear field profile),
- very low order coma which can be trimmed (linear field profile),
- very low order coma which can be centred (constant in the field),
- very low order spherical aberration which can be trimmed (constant in the field).

For all the other imaging errors, it is assumed in this case that the interferometry data as measured by the objective manufacturer and the imaging errors represented by this data remain constant over time.

In a first step, this interferometry data is used to correct systematic errors which can occur with the wavefront structure mentioned above from lithographic parameters with the aid of the linear model. The reason for these systematic errors is the influence of higher-order Zernike coefficients which cannot be taken into account in the inverse method for wavefront reconstruction. One suitable correction procedure which may be used is as follows.

After an aerial image measurement of aerial image shifts in the x and y directions (the plane at right angles to the optical axis) for eight different exposure/shutter settings, the Zernike coefficients can be calculated on the basis of the linear model, as follows:

$$\begin{bmatrix} \partial x\, meas_{set1} \\ \partial x\, meas_{set2} \\ \partial x\, meas_{set3} \\ \partial x\, meas_{set4} \\ \partial x\, meas_{set5} \\ \partial x\, meas_{set6} \\ \partial x\, meas_{set7} \\ \partial x\, meas_{set8} \end{bmatrix} = \begin{bmatrix} dx\, high_{set1} \\ dx\, high_{set2} \\ dx\, high_{set3} \\ dx\, high_{set4} \\ dx\, high_{set5} \\ dx\, high_{set6} \\ dx\, high_{set7} \\ dx\, high_{set8} \end{bmatrix} + \begin{bmatrix} S_{set1,Z2} & S_{set1,Z7} & S_{set1,Z14} \\ S_{set2,Z2} & S_{set2,Z7} & S_{set2,Z14} \\ S_{set3,Z2} & S_{set3,Z7} & S_{set3,Z14} \\ S_{set4,Z2} & S_{set4,Z7} & S_{set4,Z14} \\ S_{set5,Z2} & S_{set5,Z7} & S_{set5,Z14} \\ S_{set6,Z2} & S_{set6,Z7} & S_{set6,Z14} \\ S_{set7,Z2} & S_{set7,Z7} & S_{set7,Z14} \\ S_{set8,Z2} & S_{set8,Z7} & S_{set8,Z14} \end{bmatrix} \cdot \begin{bmatrix} Z_2 \\ Z_7 \\ Z_{14} \end{bmatrix} \qquad (2)$$

In this case, the vector dx high includes the sum of all pattern shifts in the x direction resulting from the Zernike coefficients, except for $Z2$, $Z7$ and $Z14$. A standard procedure for calculating $Z2$, $Z7$ and $Z14$. is based on equation (2) in the sense of least-squares matching. Using a pseudo-inverse of the sensitivity matrix, this can be written as follows:

$$Z = \begin{bmatrix} Z_2 \\ Z_7 \\ Z_{14} \end{bmatrix} = pinv\left(\begin{bmatrix} S_{set1,Z2} & S_{set1,Z7} & S_{set1,Z14} \\ S_{set2,Z2} & S_{set2,Z7} & S_{set2,Z14} \\ S_{set3,Z2} & S_{set3,Z7} & S_{set3,Z14} \\ S_{set4,Z2} & S_{set4,Z7} & S_{set4,Z14} \\ S_{set5,Z2} & S_{set5,Z7} & S_{set5,Z14} \\ S_{set6,Z2} & S_{set6,Z7} & S_{set6,Z14} \\ S_{set7,Z2} & S_{set7,Z7} & S_{set7,Z14} \\ S_{set8,Z2} & S_{set8,Z7} & S_{set8,Z14} \end{bmatrix}\right) \cdot \left(\begin{bmatrix} \partial x\, meas_{set1} \\ \partial x\, meas_{set2} \\ \partial x\, meas_{set3} \\ \partial x\, meas_{set4} \\ \partial x\, meas_{set5} \\ \partial x\, meas_{set6} \\ \partial x\, meas_{set7} \\ \partial x\, meas_{set8} \end{bmatrix} - \begin{bmatrix} dx\, high_{set1} \\ dx\, high_{set2} \\ dx\, high_{set3} \\ dx\, high_{set4} \\ dx\, high_{set5} \\ dx\, high_{set6} \\ dx\, high_{set7} \\ dx\, high_{set8} \end{bmatrix}\right) \qquad (3)$$

Using the linearity of equation (3), the result Z can be separated into two parts:

$$Z = Z_0 - \Delta Z \qquad (4)$$

$$\Delta Z = \begin{bmatrix} Z_2 \\ Z_7 \\ Z_{14} \end{bmatrix} = pinv\left(\begin{bmatrix} S_{set1,Z2} & S_{set1,Z7} & S_{set1,Z14} \\ S_{set2,Z2} & S_{set2,Z7} & S_{set2,Z14} \\ S_{set3,Z2} & S_{set3,Z7} & S_{set3,Z14} \\ S_{set4,Z2} & S_{set4,Z7} & S_{set4,Z14} \\ S_{set5,Z2} & S_{set5,Z7} & S_{set5,Z14} \\ S_{set6,Z2} & S_{set6,Z7} & S_{set6,Z14} \\ S_{set7,Z2} & S_{set7,Z7} & S_{set7,Z14} \\ S_{set8,Z2} & S_{set8,Z7} & S_{set8,Z14} \end{bmatrix}\right) \cdot \begin{bmatrix} dx\, high_{set1} \\ dx\, high_{set2} \\ dx\, high_{set3} \\ dx\, high_{set4} \\ dx\, high_{set5} \\ dx\, high_{set6} \\ dx\, high_{set7} \\ dx\, high_{set8} \end{bmatrix} \qquad (5)$$

The value $Z_0$ is the result of the aerial image measurement, ignoring dx high. The value $\Delta Z$ thus represents the influence of the Zernike coefficients except for $Z2$, $Z7$ and $Z14$. This error vector is independent of the Zernike coefficients $Z2$, $Z7$ and $Z14$.

The correction procedure can be carried out easily on this basis. Initially, $\underline{\Delta Z}$ is calculated once for each objective, using equation (5).

The vector dx high is then calculated as follows for all the settings from the interferometrically determined Zernike coefficients $Z_n$ using the linear model:

$$dx\ high_{setx} = \sum_{n=10,19,23,26,39,34} S_{set\,x,Zn} \cdot Z_n \qquad (6)$$

$\underline{\Delta Z}$ is then subtracted from the resultant Zernike coefficients for each aerial image measurement.

In a second step, the interferometry data is corrected by measurement data from in-situ measurements of the wavefront aberrations in the scanner. As mentioned, the objective data as measured by the objective manufacturer makes it possible to describe the wavefront aberration with maximum accuracy.

As mentioned, it is assumed that the wavefront aberrations of the objective have changed after installation in the scanner. In this case, it is assumed that only a certain number of wave aberrations, or aberration parameters which describe this aberration, have changed (unstable aberration parameters).

If the Zernike coefficients are considered in their form integrated in the scanner (this form is referred to in the following text as a fingerprint), then it is assumed in the case of the example that only the following parameters will change: Z7 (tilt), Z7 (offset), Z8 (offset) and Z9 (offset). In the present example, these parameters, and only these parameters, are now measured once again using a suitable in-situ measurement technique, that is to say in particular using the aerial image measurement technique for wavefront reconstruction from lithographic parameters. A combined data record is then created from the result of this measurement and the interferometry data. In this way, the aberration parameters determined at the manufacturer's premises are used for the in-situ measurement at the end customer's premises, and are included in the measurement result there.

First of all, the field profiles of all the Zernike coefficients are transferred from the interferometry data.

These field profiles are then manipulated such that the parameters selected above (Z7 (tilt) and Z7/8/9 (offset) in the example) from a manipulated interferometry data correspond to the parameters measured using the in-situ measurement technique. The field profiles of all the other Zernike coefficients remain unchanged.

For a more detailed explanation, FIG. 1 shows an example in which interferometry data is combined with data from aerial image measurements. The three graphs, which are shown alongside one another, respectively show the field profiles, as measured along the X direction at wafer level (in the imaging plane of the projection objective) for Z7 (coma x), Z8 (coma y) and Z9 (spherical aberration). In this case, the solid lines identified by circles show the field profile based on the interferometry data as determined by the manufacturer. The dotted lines identified by crosses represent the corresponding field profiles from the aerial image measurement. The dashed lines identified by squares each show the combined result, including the measurement data from the interferometric measurement and data from the aerial image measurement. This example clearly shows that the interferometry data is not replaced, but is merely matched to the results of the in-situ measurement data by "tilting and shifting". The fingerprints of all the other coefficients remain unchanged.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The invention claimed is:

1. Method of manufacturing an optical imaging system comprising:

assembling the optical imaging system at a first location;

determining, at the first location, wavefront aberrations which are caused by the imaging system, using a first measurement method;

transporting the optical imaging system from the first location to the second location remote from the first location;

determining wavefront aberrations which are caused by the imaging system after transporting the optical imaging system from the first location to a second location with the aid of a second measurement method;

determining at least one first aberration parameter for the wavefront aberration on the basis of the first measurement method;

determining at least one second aberration parameter from the wavefront aberration on the basis of the second measurement method using at least the one first aberration parameter which results from the first measurement method;

adjusting the optical imaging system to adjust wavefront aberrations of the imaging system at the second location using the at least one second aberration parameter.

2. Method according to claim 1, wherein the first location is on a manufacturer's premises where the optical imaging system is manufactured, and the second location is at a customer's location where the imaging system is operated for optical imaging.

3. Method according to claim 1, wherein the first measurement method is used to determine a first set of first Zernike coefficients, and the second measurement method is used to determine a second set of second Zernike coefficients, in order to characterize the wavefront aberration.

4. Method according to claim 1, wherein the first measurement method is used to determine at least one first aberration parameter which is essentially stable with respect to fluctuations, this at least one stable aberration parameter being taken into account for determining the second aberration parameter when carrying out the second measurement method, with its value determined using the first measurement method.

5. Method according to claim 4, wherein the at least one stable first aberration parameter corresponds to a Zernike coefficient whose order is greater than 2.

6. Method according to claim 1, wherein the first measurement method is a direct method for directly determining the wavefront aberrations.

7. Method according to claim 1, wherein the first measurement method is an interferometric measurement method.

8. Method according to claim 7, wherein the interferometric measurement method is based on Shearing interferometry.

9. Method according to claim 1, wherein the second measurement method is an indirect method for indirectly determining the wavefront aberrations.

10. Method according to claim 9, wherein the second measurement method comprises measuring an aerial image which is produced by the imaging system.

11. Method according to claim 9, wherein the second measurement method is a resist-based method comprising at least one exposure of a substrate that is coated with a light-sensitive layer, and measuring the exposed substrate.

12. Method according to claim 1 further comprising: combining the optical imaging system with an illuminating system to form a microlithographic projection exposure apparatus after the step of transporting the optical system to the second location and before the steps of determining at least one second aberration parameter from the wavefront aberration on the basis of the second measurement method using at least the one first aberration parameter which results from the first measurement method; and adjusting the optical imaging system to adjust wavefront aberrations of the imaging system at the second location using the at least one second aberration parameter.

13. Optical imaging system manufactured by the method according to claim 1.

14. Optical imaging system according to claim 13, wherein the optical imaging system is a projection objective configured for incorporation into a microlithographic projection exposure apparatus.

15. Method of manufacturing a microlithographic projection exposure apparatus comprising the steps of:
assembling an illumination system;
assembling a projection objective at a first location;
determining, at the first location, wavefront aberrations which are caused by the projection objective, using a first measurement method;
transporting the projection objective from the first location to a second location remote from the first location;
combining, at the second location, the projection objective with the illuminating system to form the microlithographic projection exposure apparatus;
determining wavefront aberrations which are caused by the projection objective after combining the projection objective with the illumination system with the aid of a second measurement method;
determining at least one first aberration parameter for the wavefront aberration on the basis of the first measurement method;
determining at least one second aberration parameter from the wavefront aberration on the basis of the second measurement method using at least the one first aberration parameter which results from the first measurement method;
adjusting the projection objective integrated within the microlithographic projection exposure apparatus to adjust wavefront aberrations of the projection objective using the at least one second aberration parameter.

16. Microlithographic projection exposure apparatus manufactured by the method according to claim 15.

17. Method of operating a microlithographic projection exposure apparatus having a projection objective at a location of use of the microlithographic projection exposure apparatus comprising:
receiving, at the location of the operation, at least one first aberration parameter for wavefront aberrations which are caused by the projection objective, the first aberration parameter having been determined at a first location remote from the location of the operation, using a first measurement method;
determining wavefront aberrations which are caused by the projection objective at the location of the operation with the aid of a second measurement method that is used at a different time than the first measurement method;
determining at least one second aberration parameter from the wavefront aberrations on the basis of the second measurement method using at least the one first aberration parameter determined from the first measurement method;
adjusting the projection objective to adjust wavefront aberrations of the projection objective at the location of the operation using the at least one second aberration parameter.

18. Method according to claim 17, wherein the at least one first aberration parameter determined by the first measurement method is essentially stable with respect to fluctuations, and this at least one stable aberration parameter is taken into account in determining the second aberration parameter when carrying out the second measurement method, the value of the second aberration parameter being determined using the first measurement method.

19. Method according to claim 18, wherein the at least one stable first aberration parameter corresponds to a Zernike coefficient whose order is greater than 2.

20. Method according to claim 17, wherein the first measurement method is a direct method for directly determining the wavefront aberrations.

21. Method according to claim 17, wherein the first measurement method is an interferometric measurement method.

22. Method according to claim 17, wherein the second measurement method is an indirect method for indirectly determining the wavefront aberrations.

23. Method according to claim 22, wherein the second measurement method comprises measuring an aerial image which is produced by the imaging system.

24. Method according to claim 22, wherein the second measurement method is a resist-based method comprising at least one exposure of a substrate that is coated with a light-sensitive layer, and measuring the exposed substrate.

25. Method according to claim 17, wherein the first location is on premises of a manufacturer of the projection objective.

* * * * *